United States Patent [19]
Masuri et al.

[11] Patent Number: 5,760,466
[45] Date of Patent: Jun. 2, 1998

[54] SEMICONDUCTOR DEVICE HAVING IMPROVED HEAT RESISTANCE

[75] Inventors: Kenji Masuri; Yoshihiro Hosoi; Hisashi Kojima; Kazuhito Imuta, all of Kokubu; Hiroshi Matsumoto, Gamou-gun, all of Japan

[73] Assignee: Kyocera Corporation, Kyoto, Japan

[21] Appl. No.: 878,672

[22] Filed: Jun. 20, 1997

Related U.S. Application Data

[63] Continuation of Ser. No. 634,646, Apr. 18, 1996, abandoned.

[30] Foreign Application Priority Data

Apr. 20, 1995 [JP] Japan ................................. 7-094980
Dec. 22, 1995 [JP] Japan ................................. 7-335170

[51] Int. Cl.$^6$ ........................... H01L 23/00; H01L 23/28; H01L 23/02; H05K 5/02
[52] U.S. Cl. ........................ 257/672; 257/668; 257/687; 257/705; 257/753; 257/698; 257/650; 257/633; 257/693; 257/787; 438/123
[58] Field of Search .................. 257/668, 672, 676, 687, 692, 693, 698, 700–703, 789, 795, 787, 633, 634, 650, 784, 705, 709, 753; 438/123

[56] References Cited

U.S. PATENT DOCUMENTS

| | | | |
|---|---|---|---|
| 4,541,003 | 9/1985 | Otsuka et al. | 257/704 |
| 4,656,499 | 4/1987 | Butt | 257/703 |
| 4,691,225 | 9/1987 | Murakami et al. | 257/702 |
| 4,839,717 | 6/1989 | Phy et al. | 257/700 |
| 5,070,393 | 12/1991 | Nakagawa et al. | 257/700 |
| 5,087,964 | 2/1992 | Hatta | 257/791 |
| 5,302,852 | 4/1994 | Kaneda et al. | 257/701 |
| 5,365,409 | 11/1994 | Kwon et al. | 257/676 |
| 5,402,318 | 3/1995 | Otsuka et al. | 257/787 |
| 5,559,316 | 9/1996 | Iomoda | 257/476 |

FOREIGN PATENT DOCUMENTS

| | | | |
|---|---|---|---|
| 0082448 | 4/1986 | Japan | 257/787 |
| 0098753 | 5/1987 | Japan | 257/787 |
| 0142149 | 5/1990 | Japan | 257/787 |
| 0105961 | 5/1991 | Japan | 257/787 |
| 0243429 | 9/1993 | Japan | 257/700 |

*Primary Examiner*—Tom Thomas
*Assistant Examiner*—Alexander Oscar Williams
*Attorney, Agent, or Firm*—Loeb & Loeb LLP

[57] ABSTRACT

A semiconductor device including an insulating substrate which has a semiconductor element-mounting portion for mounting a semiconductor element on the center of its top surface, and a plurality of metallized wiring layers which lead outward extendedly from the periphery of the semiconductor element-mounting portion to the rim of the top surface; a semiconductor element which is mounted on the semiconductor element-mounting portion and has electrodes connected to the inner end sections of the metallized wiring layers; a plurality of outer lead terminals which are attached to the outer end sections of the metallized wiring layers to connect the semiconductor element to an exterior electric circuit; and a molding resin which covers the insulating substrate, the semiconductor element and part of the outer lead terminals.

10 Claims, 1 Drawing Sheet

SEMICONDUCTOR DEVICE HAVING IMPROVED HEAT RESISTANCE

This is a continuation of application Ser. No. 08/634,646 filed on Apr. 18, 1996, now abandoned.

BACKGROUND OF THE INVENTION

1. Field of the Invention

The present invention relates to a semiconductor device for use in information processors such as computers.

2. Description of the Related Art

Conventional semiconductor devices for use in information processors such as computers, which are constructed with a semiconductor element, a die pad for mounting the semiconductor element thereon, a plurality of outer lead terminals extending outward from the periphery of the die pad with a given lead pitch, and a molding resin which covers the semiconductor element, the die pad and part of the outer lead terminals, are fabricated by integrally bonding the die pad and the plurality of outer lead terminals via a frame-type bonding structure to prepare a lead frame, mounting the semiconductor element on the top surface of the die pad on the lead frame, establishing electrical connections between respective electrodes of the semiconductor element by means of bonding wires, and covering the semiconductor element, the die pad and part of the outer lead terminals with the molding resin.

Here, the lead frame, which is constructed of a metal consisting mainly of copper or iron, is manufactured by subjecting a metal sheet consisting mainly of copper or iron to a metalworking process such as conventional stamping or etching.

Such conventional semiconductor devices as mentioned above, after the semiconductor element, the die pad and part of the outer lead terminals have been covered with the molding resin, are connected to an exterior electric circuit by cutting the outer lead terminals off the frame-like bonding structure to establish electric isolation of the respective outer lead terminals, placing one end of each of the outer lead terminals between wiring conductors on the exterior electric circuit board, with a soldering material sandwiched between them, and reflowing the soldering material to connect the outer lead terminals to the exterior electric circuit board, thus establishing connections between the respective electrodes of the semiconductor element mounted inside and the exterior electric circuit through the outer lead terminals.

Recently, however, the density of semiconductor elements is drastically increasing due to greatly increasing electrode counts, thus resulting in reduced widths of as small as 0.3 mm or less for outer lead terminals used for connection of respective electrodes of a semiconductor element to an exterior electric circuit and extremely small spacings of 0.3 mm or less between neighboring outer lead terminals. Therefore, semiconductor devices of the prior art as mentioned above have a drawback in that the outer lead terminals readily deform when subjected to an external force which is applied, for example, to connect the outer lead terminals to an exterior electric circuit, thus causing contact of the neighboring outer lead terminals which leads to shorting or prevents the establishing of reliable, fast electric connections between the outer lead terminals and the exterior electric circuit.

As a solution to overcome the drawback mentioned above, there has been presented a semiconductor device comprising an insulating substrate which is composed of an insulating material such as aluminum oxide sinter and has a semiconductor element-mounting portion for mounting a semiconductor element on the center of its top surface, and a plurality of metallized wiring layers which lead out, extending from the periphery of the semiconductor element-mounting portion to the rim of the top surface, and are composed of powder of a high-melting point metal such as tungsten or molybdenum; a semiconductor element which is mounted on the semiconductor element-mounting portion of the insulating substrate and has electrodes connected to inner end sections of the metallized wiring layers; a plurality of outer lead terminals which are attached to outer end sections of the metallized wiring layers to connect the semiconductor element to an exterior electric circuit; and a molding resin which covers the insulating substrate, the semiconductor element and part of the outer lead terminals.

With this type of semiconductor device, since the outer lead terminals are attached to the outer end sections of the metallized wiring layers leading out and extending it is possible to increase the widths of and the spacings between the outer lead terminals, thus preventing deformation of the outer lead terminals while maintaining electric isolation between the neighboring outer lead terminals.

Fabrication of the semiconductor device mentioned above usually involves placement of an insulating substrate with a semiconductor element and outer lead terminals mounted on its top surface in a predetermined mold, and injection of a liquid resin such as epoxy resin into the mold, followed by thermal setting of the injected resin to cover the insulating substrate, the semiconductor element and part of the outer lead terminals with the molding resin.

With this semiconductor device of the prior art, however, since the surface of the metallized wiring layers composed of powder of a high-melting point metal such as tungsten which are formed on the insulating substrate has very slight degrees of unevenness as represented by Ra+0.8 µm, wherein Ra is the average center-line roughness (defined in JIS-B-0601), the surface tends to adsorb water. This therefore causes a drawback in that coating a molding resin onto the metallized wiring layers with water adsorbed on their surface results in poor adhesion between the metallized wiring layers and the molding resin due to the presence of the water, and, upon application of reflowing heat, this results in not only delamination of the metallized wiring layers and the molding resin, but also cracking of the molding resin (producing reflow cracks), thus preventing long-term, normal and steady operation of the semiconductor element housed therein.

In addition, with the semiconductor devices mentioned above, since the surface of the insulating substrate is usually flat as indicated by its average center-line roughness Ra≦0.3 µm, placement of the insulating substrate with a semiconductor element and outer lead terminals mounted on its top surface in the predetermined mold, injection of a liquid resin such as epoxy resin into the mold by dropping, and the subsequent thermal setting of the injected resin at a temperature on the order of 180° C. and a pressure of 100 kgf/mm$^2$ to cover the insulating substrate, the semiconductor element, etc. with a molding resin, result in poor, two-dimensional bonding of the molding resin to the insulating substrate. Therefore, when heat is applied to connect the semiconductor device to an exterior electric circuit by soldering or some other means, or when heat produced during operation of the semiconductor element is applied, both the molding resin and the insulating substrate are influenced by the heat, thus delaminating the molding resin and the insulating substrate due to thermal stress caused by their difference in thermal expansion, and this prevents transmission of heat produced during operation of the semiconductor element from the insulating substrate to the molding resin and subsequent dissipation of heat to the outside via the molding resin: the result is increased temperature of the semiconductor element due to the heat produced by the semiconductor element itself, which may present the drawback of thermal destruction of the semiconductor element, and thermal deterioration of the characteristics, thus triggering malfunction of the element.

SUMMARY OF THE INVENTION

The present invention, which has been accomplished in view of the drawbacks mentioned above, is aimed at providing a semiconductor device which prevents production of reflow cracks even upon application of reflowing heat to the semiconductor device to allow long-term, normal and steady operation of a semiconductor element.

It is another object of the present invention to provide a semiconductor device which is designed to dissipate heat produced during the operation of the semiconductor element to thereby allow long-term, normal and steady operation of a semiconductor element.

According to the present inventions there is provided a semiconductor device comprising an insulating substrate which has a semiconductor element-mounting portion for mounting a semiconductor element on the center of its top surface, and a plurality of metallized wiring layers which lead outward extendedly from the periphery of the semiconductor element-mounting portion to the rim of the top surface; a semiconductor element which is mounted on the semiconductor element-mounting portion and has electrodes connected to the inner end sections of the metallized wiring layers; a plurality of outer lead terminals which are attached to the outer end sections of the metallized wiring layers to connect the semiconductor element to an exterior electric circuit; and a molding resin which covers the insulating substrate, the semiconductor element and part of the outer lead terminals, characterized in that inorganic insulating layers cover the surface of the metallized wiring layers except for their inner end sections connected to the electrodes of the semiconductor element and their outer end sections to which the outer lead terminals are attached.

With the semiconductor device mentioned above, the difference in the coefficients of thermal expansion of the inorganic insulating layers and the insulating substrate is preferably $4.0 \times 10^{-6}$/°C. or less.

It is particularly preferred that the inorganic insulating layers be composed of substantially the same material as that of the insulating substrate.

Also, with the semiconductor device mentioned above, the surface roughness of the inorganic insulating layers in terms of the average center-line roughness (Ra) preferably satisfies $0.5 \ \mu m \leq Ra \leq 2.0 \ \mu m$, and has the distribution of asperity heights (Pc) along a 2.5 mm-portion of the surface: 10–90 asperities satisfying $0.05 \ \mu m \leq Pc < 0.1 \ \mu m$, 10–90 asperities satisfying $0.1 \ \mu m \leq Pc < 0.5 \ \mu m$, 60 or less asperities satisfying $0.5 \ \mu m \leq Pc < 1.0 \ \mu m$, and 30 or less asperities satisfying $1.0 \ \mu m \leq Pc < 5.0 \ \mu m$.

According to the present invention, there is provided a semiconductor device comprising an insulating substrate which has a semiconductor element-mounting portion for mounting a semiconductor element on the center of its top surface, and a plurality of metallized wiring layers which lead outward extendedly from the periphery of the semiconductor element-mounting portion to the rim of the top surface; a semiconductor element which is mounted on the semiconductor element-mounting portion and has electrodes connected to the inner end sections of the metallized wiring layers; a plurality of outer lead terminals which are attached to the outer end sections of the metallized wiring layers to connect the semiconductor element to an exterior electric circuit; and a molding resin which covers the insulating substrate, the semiconductor element and part of the outer lead terminals, characterized in that the surface roughness of the insulating substrate in terms of the average centerline roughness (Ra) satisfies $0.5 \ \mu m \leq Ra \leq 2.0 \ \mu m$, and has the distribution of asperity heights (Pc) along a 2.5 mm-portion of the surface: 10–90 asperities satisfying $0.05 \ \mu m \leq Pc < 0.1 \ \mu m$, 10–90 asperities satisfying $0.1 \ \mu m \leq Pc < 0.5 \ \mu m$, 60 or less asperities satisfying $0.5 \ \mu m \leq Pc < 1.0 \ \mu m$, and 30 or less asperities satisfying $1.0 \ \mu m \leq Pc < 5.0 \ \mu m$.

In one aspect of the present invention, since most of the metallized wiring layers are covered with the inorganic insulating layers with excellent adhesion to the molding resin, the area of contact between the metallized wiring layers with water adsorbed thereon and the molding resin is extremely reduced, and as a result, there is almost no delamination of the metallized wiring layers and the molding resin or cracking of the molding resin even when the metallized wiring layers and the molding resin are influenced by reflowing heat, thus allowing hermetic housing of the semiconductor element at all times for long-term, normal and steady operation of the semiconductor element.

In another aspect of the present invention, since the insulating substrate has a surface roughness within the range mentioned above in terms of the average center-line roughness (Ra) and a distribution of asperity heights (Pc) along a 2.5 mm-portion of the surface within the range mentioned above, placement of an insulating substrate with a semiconductor element and outer lead terminals mounted on its top surface in a predetermined mold, injection of a liquid resin such as epoxy resin into the mold by dropping, and subsequent thermal setting of the injected resin at a temperature on the order of 180° C. and a pressure of 100 kgf/mm² in order to cover the insulating substrate, the semiconductor element, etc. result in strong, three-dimensional bonding between the insulating substrate and the molding resin, and this prevents delamination of the molding resin from the insulating substrate even when heat is applied to the insulating substrate and the molding resin, and allows excellent transmission of heat produced during the operation of the semiconductor element from the insulating substrate to the molding resin and subsequent excellent dissipation of heat to the outside via the molding resin, thus maintaining the semiconductor element at a low temperature at all times to allow long-term, normal and steady operation of the semiconductor element.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
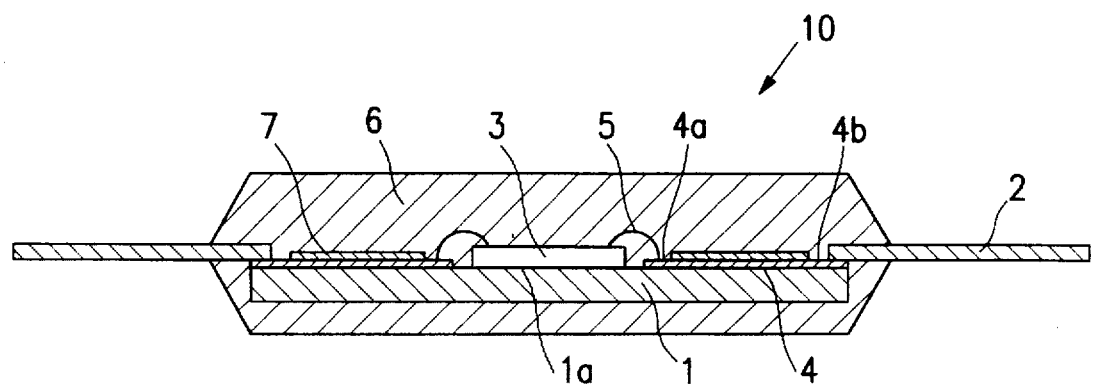
FIG. 1 is a cross sectional view of an embodiment of the semiconductor device according to the present invention.

Now referring to the drawings, preferred embodiments of the invention are described below.

In FIG. 1 illustrative of an embodiment of the semiconductor device according to the present invention, 1 is an insulating substrate, 2 is an outer lead terminal, 3 is a semiconductor element, and 10 is a semiconductor device.

The insulating substrate 1 has a semiconductor element-mounting portion 1a for mounting the semiconductor element 3 on the center of its top surface, and the semiconductor element 3 is securely bonded to the semiconductor element-mounting portion 1a by means of an adhesive such as a brazing material, glass or resin.

The insulating substrate 1 is composed of an insulating material such as aluminum oxide-based sinter, aluminum nitride-based sinter, mullite-based sinter, silicon carbide-based sinter or glass ceramic sinter, and when it is composed of aluminum oxide-based sinter, for example, it is prepared by mixing powder of raw materials including aluminum oxide, silicon oxide, calcium oxide and magnesium oxide with an appropriate binder and solvent added thereto to prepare a sludge-like ceramic slurry, subjecting the resulting ceramic slurry to a sheet-forming technique such as the well-known doctor blade process or roll-calendering process to prepare a ceramic green sheet, appropriately shaping the ceramic green sheet by cutting or stamping while layering a plurality of the sheets if necessary, and finally firing the ceramic green sheet(s) at a temperature on the order of 1600° C. in a reducing atmosphere.

A plurality of metallized wiring layers 4 are formed extending outward, covering from the periphery of the semiconductor element-mounting portion 1a on the top surface of the insulating substrate 1 to its rim, and the respective electrodes of the semiconductor element 3 are electrically connected to the inner end sections 4a of the metallized wiring layers 4, while the outer lead terminals 2 for electric connections to an exterior electric circuit are attached to the outer end sections 4b of the metallized wiring layers 4.

The metallized wiring layers 4 are composed of a metal material such as tungsten, molybdenum, manganese or aluminum: in cases where it is composed of a high-melting point metal such as tungsten, molybdenum or manganese, a metal paste prepared by mixing powder of tungsten or the like with an appropriate organic binder and solvent added thereto, is printed in advance to a given pattern by well known screen printing or another method for providing thick films, thus extending the metallized wiring layers 4 outward from the periphery of the semiconductor element-mounting portion 1a of the insulating substrate 1 to its rim, whereas in cases where the metallized wiring layers 4 are composed of aluminum or the like, the metallized wiring layers 4 are formed extending outward from the periphery of the semiconductor element-mounting portion 1a on the insulating substrate 1 to its rim by coating the top surface of the insulating substrate 1 with an aluminum film with a given thickness by evaporation, sputtering or another method, and then processing the aluminum film to a given pattern by conventional, well-known photolithography.

Here, in cases where the exposed surface of the metallized wiring layers 4 is cladded by plating to a thickness of 1.0–20.0 μm with a metal such as nickel or gold which is highly resistant to corrosion, and exhibits excellent wetting when subjected to wire bonding and excellent brazability, not only is oxidative corrosion of the metallized wiring layers 4 effectively prevented, but also connections between the metallized wiring layers 4 and the bonding wires 5, and the attachment of the outer lead terminals 2 to the metallized wiring layers 4 are easily and securely accomplished.

Accordingly, the exposed surface of the metallized wiring layers 4 is preferably cladded by plating to a thickness of 1.0–20.0 μm with a metal such as nickel or gold which is highly resistant to corrosion, and exhibits excellent wetting when subjected to wire bonding and excellent brazability.

The outer lead terminals 2 attached to the outer end sections 4b of the metallized wiring layers 4 have the function of connecting the semiconductor element 3 to an exterior electric circuit; the semiconductor element 3 is electrically connected to an exterior electric circuit via the metallized wiring layers 4 and the outer lead terminals 2 by connecting the outer lead terminals 2 to wiring conductors of the exterior electric circuit board.

Since the metallized wiring layers 4 to which the outer lead terminals 2 are attached extending outward from the periphery of the semiconductor element-mounting portion 1a located on the center of the insulating substrate 1 to the rim of its top surface, and thus the metallized wiring layers 4 have increased widths and spacings between the neighboring metallized wiring layers 4 in the outer regions of the insulating substrate 1, the outer lead terminals 2 may have increased widths and spacings between the neighboring lead terminals 2 as well: as a result, the outer lead terminals 2 do not become greatly deformed even upon application of an external force, thus allowing establishment of electric connections of the outer lead terminals 2 to a given exterior electric circuit in an exact and reliable manner while maintaining electric isolation between the neighboring outer lead terminals 2.

Here, the outer lead terminals 2 are constructed of a metal such as a copper alloy consisting mainly of copper or an iron alloy consisting mainly of iron, and are prepared by appropriately stamping or etching thin plates of a copper alloy consisting mainly of copper, for example, to given shapes.

The attachment of the outer lead terminals 2 to the metallized wiring layers 4 is accomplished by brazing the outer lead terminals 2 to the metallized wiring layers 4 by means of a brazing material such as a gold-tin-lead-silver alloy or a gold-tin-lead-palladium alloy.

Alternatively, the connections of the outer lead terminals and the metallized wiring layers 4 are accomplished by heating under Pressure using a heater tip, etc.

Since the surface of the metallized wiring layers 4 except for their inner end sections 4a to which the respective electrodes of the semiconductor element 3 are connected and their outer end sections 4b to which the outer lead terminals 2 are attached, is covered with the inorganic insulating layers 7, when the insulating substrate 1 on which the metallized wiring layers 4 are formed is coated with the molding resin 6, the area of contact between the metallized wiring layers 4 with water adsorbed thereon and the molding resin 6 is extremely reduced, and thus there is almost no delamination of the metallized wiring layers 4 and the molding resin 6 or cracking of the molding resin 6 even when the metallized wiring layers 4 and the molding resin 6 are influenced by reflowing heat, thus allowing hermetic housing of the semiconductor element 3 at all times for long-term, normal and steady operation of the semiconductor element.

Here, the inorganic insulating layers 7 are composed of an inorganic insulating material such as glass or ceramic; in cases where they are composed of ceramic, for example, they are formed on the metallized wiring layers 4 except for the inner end sections 4a and the outer end sections 4b, to cover them by mixing powder of raw materials of the ceramic, including aluminum oxide, silicon oxide, calcium oxide and magnesium oxide, with an appropriate binder and solvent added thereto to prepare an insulating ceramic paste, and printing the paste onto a ceramic green sheet which has a given pattern of a metal paste printed thereon and is completed as the insulating substrate 1, by a method for providing thick films such as well-known screen printing in such a manner as to cover part of the metal paste printed to the given pattern. Alternatively, the insulating ceramic paste may be separately applied to the respective wires in the metallized wiring layers 4.

The inorganic insulating layers 7 composed of ceramic or the like have more excellent adhesion to the molding resin 6 as compared with the adhesion between the metallized wiring layers 4 and the molding resin 6, thus further improving the hermeticity of the semiconductor element 3.

In addition, in cases where the inorganic insulating layers 7 are formed of an inorganic material chosen to reduce the difference in the coefficients of thermal expansion of the inorganic insulating layers 7 and the insulating substrate 1 to $4.0 \times 10^{-6}/°C$, or less, there is no risk of producing extra thermal stress due to the difference in the coefficients of thermal expansion even if reflowing heat or heat produced during operation of the semiconductor element 3 are applied to the insulating substrate 1 and the inorganic insulating layers 7, and this allows the insulating substrate 1 to be firmly coated with the inorganic insulating layers 7.

Particularly, in cases where the inorganic insulating layers 7 are formed of substantially the same material as that of the insulating substrate 1, since the coefficient of thermal expansion of the inorganic insulating layers 7 is naturally substantially the same as the coefficient of thermal expansion of the insulating substrate 1, the risk of producing thermal stress is further reduced.

Accordingly, it is particularly preferable to form the inorganic insulating layers 7 with substantially the same material as that of the insulating substrate 1.

The insulating substrate 1 with the semiconductor element 3 and the outer lead terminals 2 mounted thereon is further coated, except on part of the outer lead terminals 2, with the molding resin 6 made of a resin such as epoxy resin, and is completed as the finished semiconductor device 10 by completely shielding the semiconductor element 3 from the outside air.

The coating of the insulating substrate 1, the semiconductor element 3 and the outer lead terminals 2 with the molding resin 6 is accomplished by placing the insulating substrate 1 with the semiconductor element 3 and the outer lead terminals 2 mounted on its top surface in a predetermined mold, injecting a molding resin composed of epoxy resin or the like into the mold, and then thermally setting the injected molding resin.

With the semiconductor device 10 according to the present invention which is prepared as described above, one end of each of the outer lead terminals 2 is placed between wiring conductors on an exterior electric circuit board, with a soldering material sandwiched between them, and the soldering material is reflowed to connect the outer lead terminals 2 to the exterior electric circuit board, thus establishing connections between the respective electrodes of the semiconductor element 3 mounted inside and the exterior electric circuit through the outer lead terminals 2.

Figure 2:
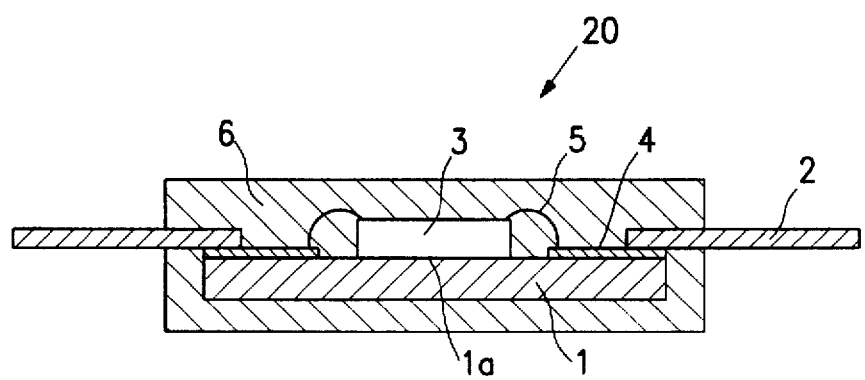
FIG. 2 is a cross sectional view of another embodiment of the semiconductor device according to the present invention.

In FIG. 2 illustrative of another embodiment of the semiconductor device 20 according to the present invention, 1 is an insulating substrate, 2 is an outer lead terminals 3 is a semiconductor element, 4 is a metallized wiring layer, 5 is a bonding wire, 6 is a molding resin, and 20 is a semiconductor device.

Likewise in FIG. 1, the insulating substrate 1 has a mounting portion 1a for mounting the semiconductor element 3 on the center of its top surface, and the semiconductor element 3 is securely bonded to the mounting section 1a by means of an adhesive such as resin, glass or a brazing material.

A plurality of wiring layers 4 are formed extending outward, from the periphery of the semiconductor element-mounting section 1a on the top surface of the insulating substrate 1 to its rim, and the respective electrodes of the semiconductor element 3 are electrically connected to the periphery of the semiconductor element-mounting portion 1a in the wiring layers 4, while the outer lead terminals 2 for connections to an exterior electric circuit are attached to the rim of the insulating substrate 1.

The quality of materials for the respective components (e.g., the insulating substrate 1, the metallized wiring layers 4, etch), methods of connecting the respective components and functions thereof were individually explained above in regard to the configuration of and methods of assembling the semiconductor device 10, and thus further explanation thereof is omitted. In FIGS. 1 and 2, the components indicated by the same reference numbers are substantially the same or equivalent components.

The semiconductor device 20 shown in FIG. 2 is assembled in the same manner as the semiconductor device of FIG. 1.

The insulating substrate 1 with the semiconductor element 3 and the outer lead terminals 2 attached thereto is coated, except on part of the outer lead terminals 2, with the molding resin 6 made of epoxy resin or the like, and is completed as the finished semiconductor device 10 by completely shielding the semiconductor element 3 from the outside air.

The coating of the semiconductor element 3 and the outer lead terminals 2 with the molding resin 6 is accomplished by placing the insulating substrate 1 with the semiconductor element 3 and the outer lead terminals 2 attached to its top surface in a predetermined mold, injecting a liquid resin composed of epoxy resin or the like into the mold by dropping, and then thermally setting the injected resin at a temperature on the order of 180° C., and a pressure of 100 kgf/mm$^2$.

A characteristic aspect of the present embodiment resides in that the insulating substrate 1 has an appropriate degree of surface roughness as represented by $0.5 \ \mu m \leq Ra \leq 2.0 \ \mu m$ in terms of the average center-line roughness (Ra) defined in JIS-B-0601, and by the distribution of asperity heights (Pc) along a 2.5 mm-portion of the surface: 10–90 asperities satisfying $0.05 \ \mu m \leq Pc < 0.1 \ \mu m$, 10–90 asperities satisfying $0.1 \ \mu m \leq Pc < 0.5 \ \mu m$, 60 or less asperities satisfying $0.5 \ \mu m \leq Pc < 1.0 \ \mu m$, and 30 or less asperities satisfying $1.0 \ \mu m \leq Pc < 5.0 \ \mu m$.

Under the above conditions, placement of an insulating substrate 1 with a semiconductor element 3 and outer lead terminals 2 mounted on its top surface, and injection of epoxy resin into the mold by dropping, to cover the semiconductor element 3, etc. with the molding resin 6, result in a strong, three-dimensional bonding between the insulating substrate 1 and the molding resin 6, and this prevents delamination of the molding resin 6 from the insulating substrate 1 even when heat is applied to the insulating substrate 1 and the molding resin 6, and consequently allows excellent transmission of heat produced during operation of the semiconductor element 3 from the insulating substrate 1 to the molding resin 6 and subsequent excellent dissipation of heat to the outside via the molding resin 6, thus maintaining the semiconductor element 3 at a low temperature at all times to allow long-term, normal and steady operation of the semiconductor element.

Here, when the insulating substrate 1 has a surface roughness represented by Ra<0.5 µm wherein Ra is the average center-line roughness defined in JIS-B-0601, the surface of the insulating substrate 1 is too smooth to securely bond the molding resin 6 to the insulating substrate 1, whereas in cases where Ra>2.0 µm, the surface of the insulating substrate 1 adsorbs much water which is vaporized and expanded by heat produced by the semiconductor element, etc., and the consequent cracking of the molding resin 6 causes breakage of the shielding of the semiconductor element from the outside air, thus preventing the long-term, normal and steady operation of the semiconductor element 3. Therefore, the surface roughness of the insulating substrate 1 is set within the range of 0.5 µm≦Ra≦2.0 µm in terms of the average center-line roughness (Ra) defined in JIS-B-0601.

Here, when the unevenness of the surface of the insulating substrate 1, which is measured along a 2.5 mm-portion with SURF CODER SE30D manufactured by Kosaka Laboratories, Inc., is represented by the distribution of 10 or less asperities satisfying 0.05 µm≦Pc<0.1 µm, and 10 or less asperities satisfying 0.1 µm≦Pc<0.5 µm in terms of the asperity height (Pc), the surface of the insulating substrate 1 is too smooth to securely bond the molding resin 6 to the insulating substrate 1, whereas in cases where there exist more than 90 asperities satisfying 0.05 µm≦Pc<0.1 µm, more than 90 asperities satisfying 0.1 µm≦Pc<0.5 µm, more than 60 asperities satisfying 0.5 µm°C Pc<0.1 µm and more than 30 asperities satisfying 1.0 µm≦Pc<5.0µ, the surface of the insulating substrate 1 adsorbs much water which is vaporized and expanded by heat produced by the semiconductor element, etc., and the consequent cracking of the molding resin 6 causes breakage of the shielding of the semiconductor element from the outside air, thus preventing the long-term, normal and steady operation of the semiconductor element 3. Therefore, the insulating substrate 1 is designed to have 10–90 asperities satisfying 0.05 µm≦Pc<0.1 µm, 10–90 asperities satisfying 0.1 µm≦Pc<0.5 µm, 60 or less asperities satisfying 0.5 µm≦Pc<1.0 µm, and 30 or less asperities satisfying 1.0 µm≦Pc<6.0 µm in terms of the asperity height (Pc) measured along a 2.5 mm-portion of the surface.

In addition, insulating substrate materials having the surface characteristics defined above may also be used for formation of the inorganic insulating layers 7 of the semiconductor device 10 (FIG. 1) according to the first embodiment. Here, the inorganic insulating layers 7 are covered with the molding resin 6. The result is a strong, three-dimensional bonding between the inorganic insulating layers 7 and the molding resin 6 which produces entirely the same effects as the insulating substrate 1 according to the embodiment described above.

Finally, the outer lead terminals 2 are connected to an exterior electric circuit, and the housed semiconductor element is electrically connected to the exterior electric circuit to mount the semiconductor device 20 according to the present invention in an information processor.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor device, comprising:
    an insulating substrate including a first surface having a center and a rim and a semiconductor element mounting portion for mounting a semiconductor element on the center of the first surface, the mounting portion having a periphery, the insulating substrate comprising at least one of aluminum oxide-based sinter, aluminum nitride-based sinter, mullite-based sinter, silicon carbide-based sinter and glass ceramic sinter,
    a plurality of metallized wiring layers extending outwardly on the surface from the periphery of the mounting portion to the rim of the first surface, the metallized wiring layers having at least an inner end section and outer end section, the metallized wiring layers comprising at least one of tungsten, molybdenum, manganese and aluminum, the metallized wiring layers having a surface cladded by plating with at least one of gold or nickel to a thickness of 1.0–20.0 µm,
    a semiconductor element mounted on and in direct contact with the first surface of the substrate at the mounting portion and having electrodes connected to the inner end section of the metallized wiring layers,
    a plurality of outer lead terminals attached to and in direct contact with the outer end section of the metallized wiring layers for connecting the semiconductor element to an exterior electric circuit, the outer lead terminals comprising at least one of a copper alloy comprising primarily copper and an iron alloy comprising primarily iron,
    a molding resin covering the insulating substrate, the semiconductor element and at least part of the outer lead terminals, and
    at least one inorganic insulating layer covering the surface of the metallized wiring layers and leaving uncovered at least a portion of the inner end section connected to the electrodes of the semiconductor element and the outer end section of the metallized wiring layers to which the outer lead terminals are directly attached.

2. The device of claim 1, wherein the inorganic insulating layer has a coefficient of thermal expansion, wherein the insulating substrate has a coefficient of thermal expansion, and wherein the coefficient of thermal expansion of the inorganic insulating layer and the coefficient of thermal expansion of the insulating substrate differ by not more than $4.0 \times 10^{-6}/°C$.

3. The device of claim 1, wherein the inorganic insulating layer and the insulating substrate comprise substantially the same material.

4. The device of claim 1, wherein the inorganic insulating layer has a surface roughness in terms of the average center-line roughness (Ra) that satisfies 0.5 µm≦Ra≦2.0 µm and has a distribution of asperity heights (Pc) along a 2.5 mm-portion of the surface with 10–90 asperities satisfying 0.1 µm≦Pc<0.5 µm, not more than 60 asperities satisfying 0.5 µm≦Pc<1.0 µm, and not more than 30 asperities satisfying 1.0 µm≦Pc<5.0 µm.

5. A semiconductor device, comprising:
    an insulating substrate including a first surface having a center and a rim and a semiconductor element mounting portion for mounting a semiconductor element on the center of the first surface, the mounting portion having a periphery, the insulating substrate comprising at least one of aluminum oxide-based sinter, aluminum nitride-based sinter, mullite-based sinter, silicon carbide-based sinter and glass ceramic sinter,
    a plurality of metallized wiring layers extending outwardly on the first surface from the periphery of the mounting portion to the rim of the first surface, the metallized wiring layers having at least an inner end section and outer end section, the metallized wiring layers comprising at least one of tungsten, molybdenum, manganese and aluminum, the metallized wiring layers having a surface cladded by plating with at least one of gold or nickel to a thickness of 1.0–20.0 µm, a semiconductor element mounted on and in direct contact with the first surface of the substrate at the mounting portion and having electrodes connected to the inner end section of the metallized wiring layers, a plurality of outer lead terminals attached to and in direct contact with the outer end section of the metallized wiring layers for connecting the semiconductor element to an exterior electric circuit, the outer lead terminals comprising at least one of a copper alloy comprising primarily copper and an iron alloy comprising primarily iron, a molding resin covering the insulating substrate, the semiconductor element and at least part of the outer lead terminals, wherein the insulating substrate has a surface roughness in terms of the average centerline roughness (Ra) that satisfies $0.5\ \mu m \leq Ra \leq 2.0\ \mu m$, and has a distribution of asperity heights (Pc) along a 2.5 mm-portion of the surface with 10–90 asperities satisfying $0.5\ \mu m \leq Pc < 0.1\ \mu m$, 10–90 asperities satisfying $0.1\ \mu m \leq Pc \leq 0.5\ \mu m$, not more than 60 asperities satisfying $0.5\ \mu m \leq Pc < 1.0\ \mu m$, and not more than 30 asperities satisfying $1.0\ \mu m \leq Pc < 5.0\ \mu m$.

6. A method of making semiconductor device, comprising:

providing an insulating substrate including a first surface having a center and a rim and a semiconductor element mounting portion for mounting a semiconductor element on the center of the first surface, the mounting portion having a periphery, the insulating substrate comprising at least one of aluminum oxide-based sinter, aluminum nitride-based sinter, mullite-based sinter, silicon carbide-based sinter and glass ceramic sinter, providing a plurality of metallized wiring layers extending outwardly on the surface from the periphery of the mounting portion to the rim of the first surface, the metallized wiring layers having at least an inner end section and outer end section, the metallized wiring layers comprising at least one of tungsten, molybdenum, manganese and aluminum, the metallized wiring layers having a surface cladded by plating with at least one of gold or nickel to a thickness of 1.0–20.0 µm, mounting a semiconductor element on and in direct contact with the first surface of the substrate at the mounting portion and connecting electrodes to the inner end section of the metallized wiring layers, attaching a plurality of outer lead terminals to and in direct contact with the outer end section of the metallized wiring layers for connecting the semiconductor element to an exterior electric circuit, the outer lead terminals comprising at least one of a copper alloy comprising primarily copper and an iron alloy comprising primarily iron, covering the insulating substrate, the semiconductor element and at least part of the outer lead terminals with a molding resin, and covering the surface of the metallized wiring layers with at least one inorganic insulating layer and leaving uncovered at least a portion of the inner end section connected to the electrodes of the semiconductor element and the outer end section of the metallized wiring layers to which the outer lead terminals are directly attached.

7. The method of claim 6, wherein the inorganic insulating layer has a coefficient of thermal expansion, wherein the insulating substrate has a coefficient of thermal expansion, and wherein the coefficient of thermal expansion of the inorganic insulating layer and the coefficient of thermal expansion of the insulating substrate differ by not more than $4.0 \times 10^{-6}/°C$.

8. The method of claim 6, wherein the inorganic insulating layer and the insulating substrate comprise substantially the same material.

9. The method of claim 6, wherein the inorganic insulating layer has a surface roughness in terms of the average center-line roughness (Ra) that satisfies $0.5\ \mu m \leq Ra \leq 2.0\ \mu m$ and has a distribution of asperity heights (Pc) along a 2.5 mm-portion of the surface with 10–90 asperities satisfying $0.1\ \mu m \leq Pc < 0.5\ \mu m$, not more than 60 asperities satisfying $0.5\ \mu m \leq Pc < 1.0\ \mu m$, and not more than 30 asperities satisfying $1.0\ \mu m \leq Pc < 5.0\ \mu m$.

10. A method of making a semiconductor device, comprising:

providing an insulating substrate including a first surface having a center and a rim and a semiconductor element mounting portion for mounting a semiconductor element on the center of the first surface, the mounting portion having a periphery, the insulating substrate comprising at least one of aluminum oxide-based sinter, aluminum nitride-based sinter, mullite-based sinter, silicon carbide-based sinter and glass ceramic sinter, providing a plurality of metallized wiring layers extending outwardly on the first surface from the periphery of the mounting portion to the rim of the first surface, the metallized wiring layers having at least an inner end section and outer end section, the metallized wiring layers comprising at least one of tungsten, molybdenum, manganese and aluminum, the metallized wiring layers having a surface cladded by plating with at least one of gold or nickel to a thickness of 1.0–20.0 µm, mounting a semiconductor element on and in direct contact with the first surface of the substrate at the mounting portion and having electrodes connected to the inner end section of the metallized wiring layers, attaching a plurality of outer lead terminals to and in direct contact with the outer end section of the metallized wiring layers for connecting the semiconductor element to an exterior electric circuit, the outer lead terminals comprising at least one of a copper alloy comprising primarily copper and an iron alloy comprising primarily iron, covering the insulating substrate, the semiconductor element and at least part of the outer lead terminals with a molding resin.

wherein the insulating substrate has a surface roughness in terms of the average centerline roughness (Ra) that satisfies $0.5\ \mu m \leq Ra \leq 2.0\ \mu m$, and has a distribution of asperity heights (Pc) along a 2.5 mm-portion of the surface with 10–90 asperities satisfying $0.5\ \mu m \leq Pc < 0.1\ \mu m$, 10–90 asperities satisfying $0.1\ \mu m \leq Pc < 0.5\ \mu m$, not more than 60 asperities satisfying $0.5\ \mu m \leq Pc < 1.0\ \mu m$, and not more than 30 asperities satisfying $1.0\ \mu m \leq Pc < 5.0\ \mu m$.

* * * * *